(12) United States Patent
Gracias

(10) Patent No.: US 7,018,867 B2
(45) Date of Patent: Mar. 28, 2006

(54) FABRICATING STACKED CHIPS USING FLUIDIC TEMPLATED-ASSEMBLY

(75) Inventor: David Gracias, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 260 days.

(21) Appl. No.: 10/360,042

(22) Filed: Feb. 6, 2003

(65) Prior Publication Data

US 2004/0157360 A1    Aug. 12, 2004

(51) Int. Cl.
    *H01L 21/00*    (2006.01)
(52) U.S. Cl. ........................ 438/110; 257/723
(58) Field of Classification Search ............... 156/73.6; 257/622, 623, 686, 723; 438/106–110
    See application file for complete search history.

(56) References Cited

U.S. PATENT DOCUMENTS

| 5,824,186 | A  | * | 10/1998 | Smith et al. | ................. | 438/597 |
| 6,611,237 | B1 | * | 8/2003  | Smith        | ......................... | 343/772 |
| 2003/0140317 | A1 | * | 7/2003 | Brewer et al. | ................. | 716/1 |

OTHER PUBLICATIONS

Jacobs et al., "Fabrication of a Cylindrical Display by Patterned Assembly", Science, vol. 296, pp. 323-325, Apr. 12, 2002.

Yeh et al., "Fluidic Self-Assembly For The Integration Of Gas Light-Emitting Diodes On Si Substrates", IEEE Journal of Photonics Technology Letters, vol. 6, No. 6, pp. 706-708 Jun. 1994.

Gracias et al., "Forming Electrical Networks In Three Dimensions By Self-Assembly", Science, vol. 289, p. 1170-72, Aug. 18, 2000.

* cited by examiner

*Primary Examiner*—David Nelms
*Assistant Examiner*—Calvin Lee
(74) *Attorney, Agent, or Firm*—Trop, Pruner & Hu, P.C.

(57) ABSTRACT

Fluidic self-assembly may be utilized to form a stack of two integrated circuits. The integrated circuits may include surface mount electrical connections and surface features that control the alignment between the integrated circuits. In particular, the contacts may be provided on one side of each integrated circuit and surface features may cause the integrated circuits to align with one another in an immersion fluid. The aligned circuits may join to form physical and electrical connections. The resulting structure may be a stack of two integrated circuits electrically coupled to one another.

23 Claims, 3 Drawing Sheets

FABRICATING STACKED CHIPS USING FLUIDIC TEMPLATED-ASSEMBLY

BACKGROUND

This invention relates generally to the assembly of a stack of two or more semiconductor integrated circuits.

It is known to form stacks of chips in integrated circuits. By positioning each chip in a stack and bonding them in face-to-face alignment, the distance for signals to travel from one chip to another may be reduced, resulting in faster circuits. Moreover, the stacked chip occupies less space than the individual chips (better form factor due to three dimensionality)

Commonly, stacked chips are interconnected by dielectric bonding, adhesives, or copper bonding. Wire bonds are used to electrically couple one chip to the other.

In order to combine the two integrated circuits, generally a pick and place machine is needed to position one chip precisely on the other. Adhesive adherement may also be necessary. Thereafter, the chips must be electrically bonded together, for example, using wire bonding.

Currently, logic circuits such as integrated microprocessors and memory chips are sold separately and then coupled together on a printed circuit board called a motherboard. Because of the spacing between these devices, a delay time may be induced due to the resistance and capacitance of the interconnection.

Thus, there is a need for better ways to couple integrated circuits together including, for example, logic devices and memory chips, as well as other devices.

DETAILED DESCRIPTION

Figure 1:
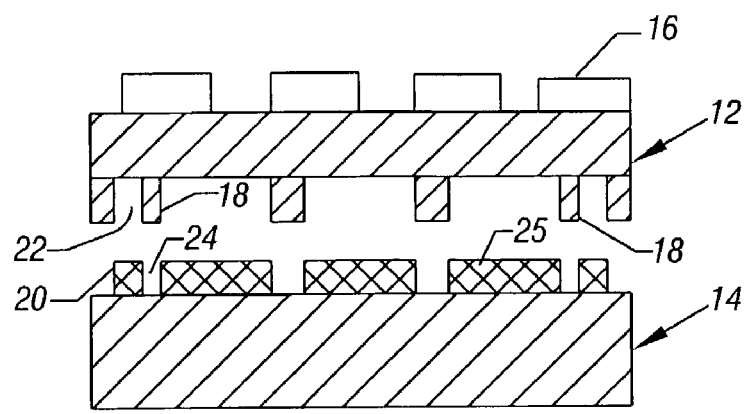
FIG. 1 is an exploded, enlarged cross-sectional view of one embodiment of the present invention.
Figure 2:
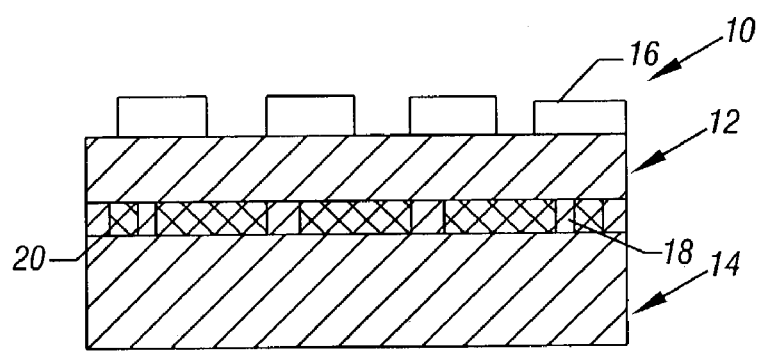
FIG. 2 is an enlarged cross-sectional view corresponding to FIG. 1 showing two integrated circuits joined together.

Referring to FIG. 1, an integrated circuit 12 may be combined with another integrated circuit 14 to form a stacked integrated circuit 10, shown in FIG. 2. The integrated circuit 12, in one embodiment, may be a memory chip and the integrated circuit 14, in one embodiment, may be a logic chip such as a microprocessor.

The chip 12 may include a surface feature 16 on its upper surface and a pattern of arrayed keys 18 on its lower surface. The region between the keys 18 may define an alignment groove 22 in accordance with one embodiment of the present invention.

The integrated circuit 14 may have a bottom surface that is featureless in one embodiment of the present invention. The upper surface of the integrated circuit 14 may include a pattern of slots 24 between surface features 20. The slots 24 are sized and shaped to mate with the keys 18 on the integrated circuit 12.

Because of the arrangement of the keys 18 and the slots 24, the integrated circuit 12 may fit on the integrated circuit 14 in only one fashion. Once aligned and connected, electrical contacts on each circuit 12 and 14 may automatically make an electrical connection between the chips 12 and 14.

In one embodiment of the present invention contacting surfaces between the chips 12 and 14 may include contacts and surface mount connections, such as solder balls. These elements may provide electrical and physical connections between the chips 12 and 14.

In one embodiment, fluidic self-assembly may be utilized to join a large number of chips 12 of one type with chips 14 of another type. For example, the chips 12 and 14, in large numbers, may be combined within a chamber (not shown) filled with an immersion fluid. The chamber may be agitated to cause the chips 12 to collide with, engage and join the chips 14. Suitable fluid may include a variety of liquids including, for example, salt water, alcohol, and high boiling-point liquids, as well as liquid solder fluxes.

In one embodiment, chips 12 of one type, such as a memory chip, cannot become joined to chips of the same type because the pattern of keys 18 is designed to interfere with the upper surface features 16. This prevents plugging of two chips 12 of the same type into one another.

In one embodiment, the fluidic self-assembly may take place in a heated fluid. The temperature of the fluid may be higher than the melting point of surface mount techniques on either or both of the chips 12 and 14. As a result, the surface mount material, such as solder, may help to join the chip 12 to the chip 14. For example, using a high temperature flux as the immersion fluid, the solder connection between the chips 12 and 14 may be facilitated. In addition, the heat of the immersion fluid may further heat the surface mount connection to form a molten material that enables a solder connection to be formed between the chips 12 and 14 using surface mount technology.

In one embodiment, the chips 12 and 14 may fit snugly together in this intermeshing fashion. In such an embodiment, intervening fluid may be displaced from between the chips 12 and 14, resulting in the reduction of possible shorts from the fluid and ensuring a better electrical connection between the two chips 12 and 14.

Figure 3:
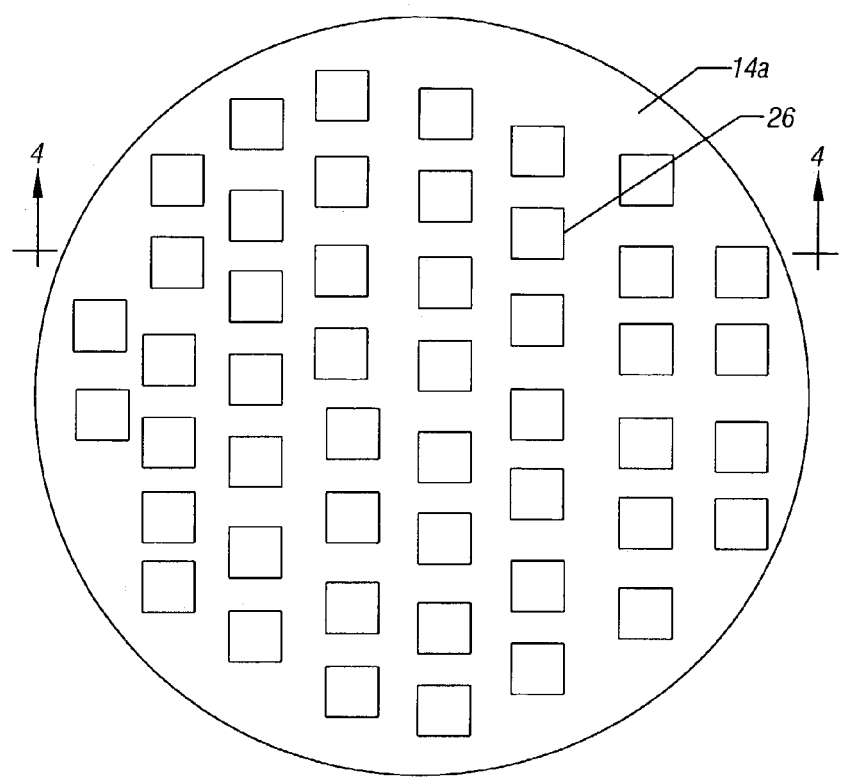
FIG. 3 is a reduced plan view of an integrated circuit wafer in accordance with one embodiment of the present invention.

Referring to FIG. 3, in accordance with another embodiment of the present invention, a wafer 14a may be a plurality of unsingulated elements destined to become chips 14. In other words, the chips 12, which have been singulated, may be joined to sites 26 on a wafer 14a that have not yet been singulated. The chips 12 may be agitated in a fluid over the wafer 14a until a large number of the sites 26 have become populated with chips 12 which have engaged the wafer 14a.

Figure 4:
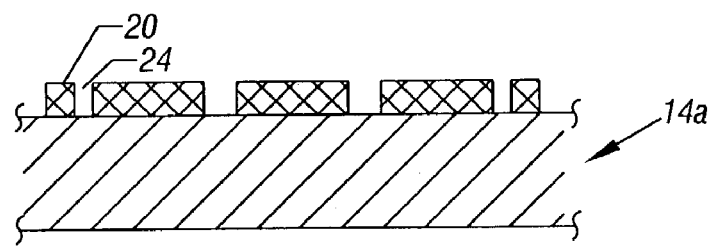
FIG. 4 is a partial, enlarged view taken generally along the line 4—4 in FIG. 3.

Thus, referring to FIG. 4, the wafer 14a may have regions 26 which include slots 24 and features 20 that correspond to the arrangement described in the singulated chip 14 of FIG. 1.

In one embodiment regions 26 are not all the same. The regions 26 may be of one or more types. Using grooves, patterns and solder bumps a recognition of the mating chips may be invoked on the system. Example a chip in FIG. 6 may mate with one site on the wafer and another chip e.g. FIG. 9 may mate with another site, e.g. squares with squares and triangles with triangles. This is especially important in system—on a chip applications where several different chips are attached to a larger chip and or a motherboard.

Figure 5:
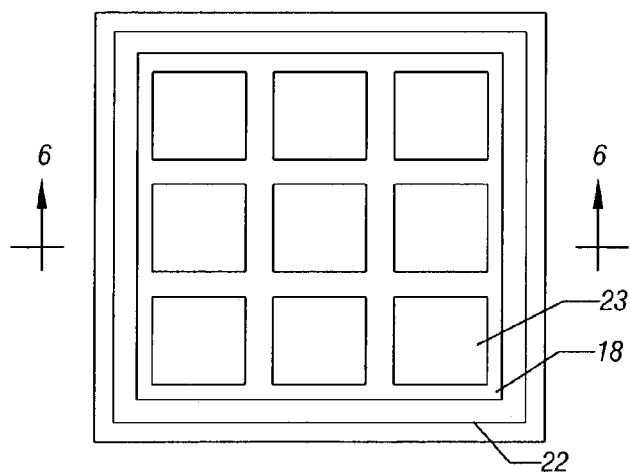
FIG. 5 is an enlarged bottom plan view of one of the devices shown in FIG. 1 in accordance with one embodiment of the present invention.

Referring to FIG. 5, each chip 12 may have a pattern of keys 18 and slots 22 which are identical to those described in the chip-to-chip connection technique shown, for example, in FIGS. 1 and 2.

Figure 6:
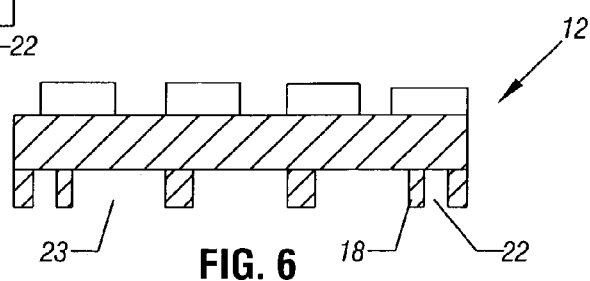
FIG. 6 is a cross-sectional view taken generally along the line 6—6 in FIG. 5.

Referring to FIG. 6 in accordance with one embodiment of the present invention, the keys 18 may form a grid-type structure that surrounds openings 23. An alignment slot 22 may then be formed around the periphery of the chip 12 as shown in FIG. 5.

Figure 7:
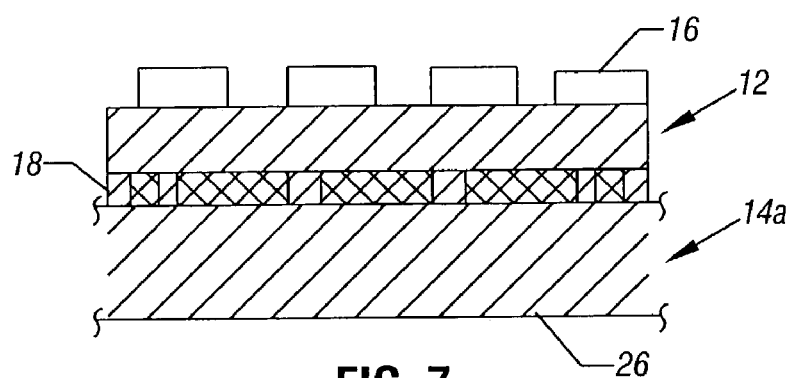
FIG. 7 is an enlarged cross-sectional view of the combination of the devices shown in FIGS. 6 and 4 in accordance with one embodiment of the present invention.

Referring now to FIG. 7, a chip 12 may engage the wafer 14a at a region 26 designed to receive a chip 12. Once a large number of chips 12 have been joined to the wafer 14 at the sites 26, the wafer 14a may be singulated to form a number of chips 10 like that shown in FIG. 2.

Figure 8:
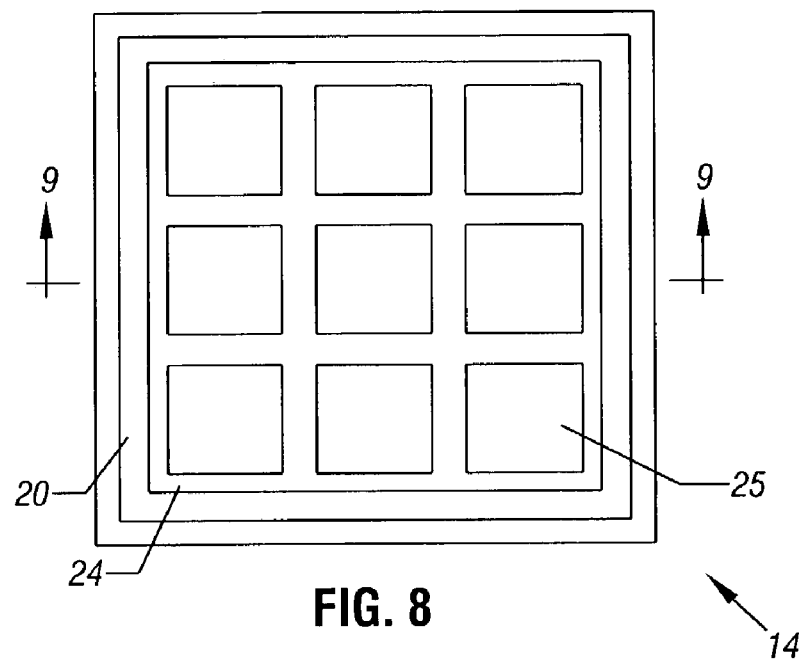
FIG. 8 is an enlarged top plan view of one of the devices shown in FIG. 1 in accordance with one embodiment of the present invention.
Figure 9:
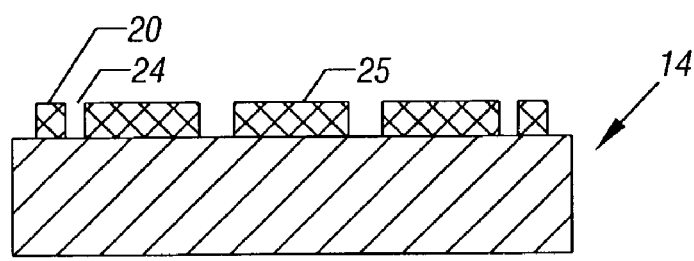
FIG. 9 is an enlarged cross-sectional view taken generally along the line 9—9 in FIG. 8 in accordance with one embodiment of the present invention.

Referring to FIG. 8, the chips 14 may have a structure which is complementary to that of the chips 12 shown in FIG. 5. In other words, as shown in FIG. 9, the chips 14 may include protrusions 25, slots 24, and features 20. The features 20 may form an alignment key that engages the alignment slot 22 of a die 12.

Figure 10:
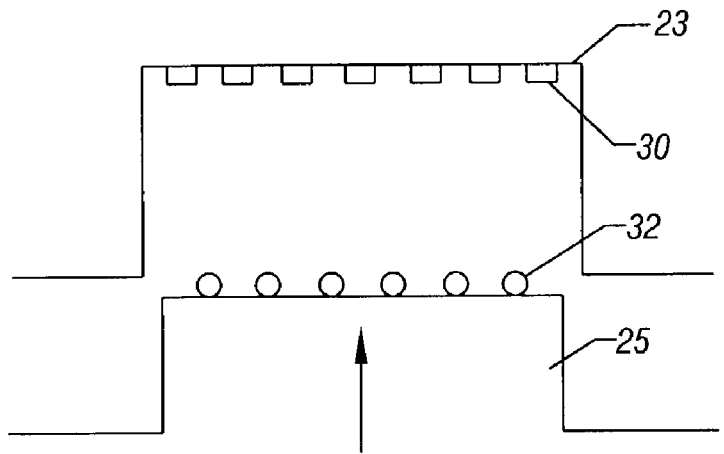
FIG. 10 is a partial, greatly enlarged, exploded view of portions of two chips in accordance with one embodiment of the present invention.

In some embodiments, solder balls 32 or other surface mount techniques may be used to join the chip 12 to either a chip 14 or a wafer 14a, as shown in FIG. 10. The solder balls 32 may, for example, be positioned on the protrusion 25 and contacts 30 may be positioned in the openings 23. The use of surface mount arrays, known as ball grid arrays, can help to provide self-alignment due to the minimization of surface tension of drops of molten solder. The forces may be large enough in some embodiments, to bond microscopic objects to one another against gravity.

The features which form the interlocking sets of protrusions or keys and slots may be formed by conventional photolithography and etching. The die may be tested and sorted. Sawing and sorting can be done on one die type, such as the chips 12 or both die types in a die-to-die templated assembly. Any defective die can then be disregarded. By disregarding the defective dice before they are joined to the wafer or other dice, the yield of attached may be reduced. This is because a defective die bonding to a good die results in a defective stacked die (thereby loosing one good die).

After the immersion fluid has cooled, the solder connection, in some embodiments, between the chips 12 and 14 may be complete. Electrical testing and sorting may be done on wafers in an embodiment in which chips 12 are joined in large numbers to a wafer 14a. Fluidic assembly to form the stack structure may then follow so that only good wafer sites 26 are reserved.

In some embodiments, the chip 12 may be a memory chip and the chip 14 or the wafer 14a may be a microprocessor. By the close and intimate bonding and automatic electrical connectivity between the chips 12 and 14, relatively fast access to memory may be achieved due to the close proximity and the reduction of RC delays in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    immersing an integrated circuit of a first type and an integrated circuit of a second type in an immersion fluid such that said circuits fit together in only one orientation wherein the integrated circuits are under a surface level of the immersion fluid.

2. The method of claim 1 including preventing said first and second types of integrated circuits from engaging circuits of the same type.

3. The method of claim 1 including abutting said circuits in face-to-face alignment.

4. The method of claim 1 including physically engaging an integrated circuit chip of a first type with an integrated circuit wafer of a second type.

5. The method of claim 1 including physically engaging circuits in the form of chips to one another to form a stack.

6. The method of claim 1 including flowing the immersion fluid.

7. The method of claim 1 including providing a key on said integrated circuits of said first type that prevents said integrated circuit of said first type from engaging said integrated circuit of said second type except at a slot on said integrated circuit of said second type.

8. The method of claim 1 including providing an engaging surface on each of said first and second types and providing a surface on at least one of said types to prevent said type from engaging itself.

9. The method of claim 1 including heating the immersion fluid.

10. The method of claim 9 including heating said immersion fluid so as to form a solder joint between said integrated circuits of said first and second types.

11. The method of claim 10 including forming the surface mount connection between said circuits of said first and second types by heating said immersion fluid.

12. The method of claim 1 including using a solder flux as said immersion fluid.

13. The method of claim 1 including solder balls on mating surfaces of said circuits of said first and second types.

14. The method of claim 13 including providing a protrusion on one of said types and a mating slot on the other of said types, and providing solder balls on at least one of said slot and said protrusion.

15. A method comprising:
    immersing an integrated circuit of a first type and an integrated circuit of a second type in an immersion fluid including solder flux; and
    surface mounting said circuits of said first type to said circuits of said second type in said fluid.

16. The method of claim 15 including providing solder balls on mating surfaces of said circuits of said first and second types.

17. The method of claim 16 including providing a protrusion on one of said types and a mating slot on the other of said types, and providing solder balls on at least one of said slot and said protrusion.

18. A method comprising:
    immersing an integrated circuit of a first type and a integrated circuit of a second type in an immersion fluid; and
    surface mounting said circuits of said first type to said circuits of said second type by heating said immersion fluid.

19. The method of claim 18 including heating said immersion fluid so as to form a solder joint between said integrated circuits of said first and second types.

20. The method of claim 19 including forming the surface mount connection between said circuits of said first and second types by heating said immersion fluid.

21. A method comprising:
   forming solder balls on an integrated circuit of a first type;
   immersing said integrated circuit of said first type and an integrated circuit of a second type in an immersion fluid; and
   surface mounting said circuits of said first type to said circuits of said second type in said fluid.

22. The method of claim 21 including providing a protrusion on one of said types and a mating slot on the other of said types, and providing solder balls on at least one of said slot and said protrusion.

23. The method of claim 21 including immersing a first and a second type that fit together in only one orientation.

* * * * *